United States Patent [19]
Zimmermann et al.

[11] Patent Number: 6,162,735
[45] Date of Patent: Dec. 19, 2000

[54] IN-SITU METHOD FOR PREPARING AND HIGHLIGHTING OF DEFECTS FOR FAILURE ANALYSIS

[75] Inventors: Gunnar Zimmermann; Rolf Christ, both of Richmond; Mark Johnston, Glenn Allen, all of Va.

[73] Assignee: Infineon Technologies North America Corp., San Jose, Calif.

[21] Appl. No.: 09/277,673

[22] Filed: Mar. 26, 1999

[51] Int. Cl.⁷ .................................................. H01L 21/00
[52] U.S. Cl. ............................ 438/712; 216/60; 216/66; 216/79; 438/8; 438/14; 438/719; 438/738
[58] Field of Search .......................... 438/8, 9, 14, 691, 438/692, 712, 719, 738; 216/38, 59, 60, 66, 79

[56] References Cited

U.S. PATENT DOCUMENTS

| | | | |
|---|---|---|---|
| 4,734,158 | 3/1988 | Gillis | 438/712 X |
| 5,395,769 | 3/1995 | Arienzo et al. | 438/8 |
| 5,399,229 | 3/1995 | Stefani et al. | 438/8 X |
| 6,071,829 | 6/2000 | Starck et al. | 438/712 |

OTHER PUBLICATIONS

"XL830/860 DualBeam Workstation Users Guide", PN 42326, FEI Company, pp. 4–32 to 4–40, 1998.

*Primary Examiner*—William Powell
*Attorney, Agent, or Firm*—Stanton C. Braden

[57] ABSTRACT

In accordance with the present invention, a method for inspecting a semiconductor sample for failures includes the steps of determining a target area for observation on the semiconductor sample, preparing a region in proximity to the target area to provide access to the target area, and mounting the semiconductor sample into a chamber. The chamber provides a capability for removing material in proximity of the target area, and provides a capability for observing the semiconductor sample in-situ. The semiconductor sample is maintained in the chamber while performing the following steps: etching a first material selective to a second material such that the target area has the first material removed therefrom to expose the second material such that the second material is preserved for observation, and monitoring the progress of the etching step to determine a time to discontinue the etching.

22 Claims, 3 Drawing Sheets

IN-SITU METHOD FOR PREPARING AND HIGHLIGHTING OF DEFECTS FOR FAILURE ANALYSIS

BACKGROUND

1. Technical Field

This disclosure relates to failure analysis and more particularly, to a failure analysis method which preferably employs xenon-difluoride gas for preparing semiconductor chips for the failure analysis.

2. Description of the Related Art

Dielectric integrity is always a concern in integrated circuit fabrication. Failed semiconductor chips are typically analyzed to discover causes of the failure or failure modes. For example, holes formed in thin oxides can be prepared and highlighted by using a two-step process in which a semiconductor chip sample is, in a first step, delayered top-down or cross-sectioned close to a target area to be observed. The target area is typically a location believed to be the cause of the failure. In a second step, the delayered top-down or cross-sectioned target area is etched using a selective silicon etch. This is followed by a scanning electron microscopy (SEM) inspection.

There are several age-old methods for analyzing dielectric integrity. Electrical methods include breakdown voltage analysis, charge to breakdown analysis, capacitance analysis, and photoemission. These electrical techniques are almost always coupled with physical analysis for confirmation and further learning. The physical analysis typically involves wet chemistry to highlight defects either in the dielectric or the underlying Si. KOH is commonly used to highlight oxide pinholes because it is highly selective, etching Si about 200 times more rapidly than $SiO_2$. Silicon decoration etchants, such as a Wright etch, dash etch, or Secco etch, are often employed to highlight pinhole damage to the Si substrate, indirectly showing oxide integrity problems.

All known methods for preparing and etching samples are ex-situ techniques. That is these techniques are carried out outside a focused ion beam (FIB) or SEM chamber. In other words, samples are removed from the FIB or SEM chamber before target areas can be exposed and/or etched for inspection inside the chamber(s). For etching, a selective Si-etch (e.g. KOH) is used. For delayering or cross-sectioning a sample, chemical or physical delayering methods (e.g. reactive ion etch (RIE), selective chemical etching, face lapping, etc.) or a combination of both are applied. As with all ex-situ methods, these techniques are strongly dependent on a precise control of every single step involved to assure an accurate result (e.g. temperature and time control during KOH etching). The process is time-consuming and requires skilled personnel to guarantee reliable results. Deviations from the original process (e.g. different layout, layer thicknesses) can enforce a readjustment of the whole process. Furthermore, the monitoring of the progress of the delayering/cross-sectioning or etching processes involves a frequent and time-consuming sample transfer into a (U)HV-chamber of an SEM (at least for modern Ultra Large Scale Integration (ULSI) semiconductor technology). Additionally, a subsequent KOH etch may be affected by Gallium-poisoning of the Si in the sample and by raster burn of the electron beam. These prior art methods are both difficult to control and time-consuming.

Therefore, a need exists for a fast, selective, site-specific method to find pinholes in dielectrics, other failed components or defects in semiconductor devices.

SUMMARY OF THE INVENTION

In accordance with the present invention, a method for inspecting a sample for failures includes the steps of determining a target area for observation on the sample, preparing a region in proximity to the target area to provide access to the target area, and mounting the sample into a chamber. The chamber provides a capability for removing material in proximity of the target area, and provides a capability for observing the sample in-situ. The sample is maintained in the chamber while performing the following steps: etching a first material selective to a second material such that the target area has the first material removed therefrom to expose the second material such that the second material is preserved for observation, and monitoring the progress of the etching step to determine a time to discontinue the etching.

In other methods, the sample may include a major surface, and the first and second materials may be disposed substantially perpendicular to the major surface. The step of preparing may then include the step of cutting away material in the region in proximity to the target area to provide access to the target area in a direction perpendicular to the major surface. The step of cutting away material may include cutting away material by employing an ion beam.

The sample may include a major surface and the first and second materials may be disposed substantially parallel to the major surface. Then, the step of preparing may include the steps of cleaving the sample to form an edge perpendicular to a layer of at least one of the first material and the second material in the region in proximity to the target area, and providing access to the target area in a direction parallel to the major surface. The sample may include a major surface, and the first and second materials may be disposed substantially parallel to the major surface. Then, the step of preparing may include the steps of polishing the sample to form an edge perpendicular to a layer of at least one of the first material and the second material in the region in proximity to the target area, and providing access to the target area in a direction parallel to the major surface. The sample may include a plurality of layers disposed substantially parallel to a major surface, and the first and second materials may be disposed substantially parallel to the major surface. Then the step of mounting the sample into a chamber may include the step of delayering the plurality of layers to expose the target area. The first material may be silicon and the second material may be oxide, nitride or a combination thereof, and the step of etching may include the step of etching the first material selective to the second material with xenon difluoride or with xenon difluoride in the presence of an electron beam. The step of monitoring the progress of the etching step may include the step of employing a scanning electron microscope during the etching step to the monitor progress.

A method for inspecting a semiconductor sample for defects in an insulating layer includes the steps of determining a target area for observation on the semiconductor sample based on a site of a failed device, preparing a region in proximity to the target area to provide access to the target area, and mounting the semiconductor sample into a chamber. The chamber provides a capability for removing material in proximity of the target area and provides a capability for observing the semiconductor sample in-situ. The semiconductor sample is maintained in the chamber while performing the following steps: removing the material in proximity of the target area, the target area including a dielectric layer having at least one defect therein, wherein a silicon material obscures the at least one defect, etching the silicon material selective to the dielectric layer such that the silicon material is removed from the dielectric layer while the dielectric layer remains substantially intact and monitoring the progress of the etching step to observe the at least one defect.

In other methods, the semiconductor sample may include a major surface and the dielectric layer may be disposed substantially perpendicular to the major surface. Then, the step of preparing may include the step of cutting away material in the region in proximity to the target area to provide access to the target area in a direction perpendicular to the major surface. The step of cutting away material may include cutting away material by employing an ion beam.

The semiconductor sample may include a major surface, and the dielectric layer may be disposed substantially parallel to the major surface. Then, the step of preparing may include the steps of cleaving the semiconductor sample to form an edge perpendicular to the dielectric layer, and providing access to the target area in a direction parallel to the major surface. The semiconductor sample may include a major surface, and the dielectric layer may be disposed substantially parallel to the major surface. Then, the step of preparing may include the steps of polishing the semiconductor sample to form an edge perpendicular to the dielectric layer in the region in proximity to the target area and providing access to the target area in a direction parallel to the major surface.

The semiconductor sample may include a plurality of layers disposed substantially parallel to a major surface of the semiconductor sample, and the dielectric layer may be disposed substantially parallel to the major surface. Then, the step of removing the material in proximity of the target area may include the step of delayering the plurality of layers to expose the target area. The step of etching may include the step of etching the silicon material with xenon difluoride or with xenon difluoride in the presence of an electron beam. The step of monitoring the progress of the etching step may include the step of employing a scanning electron microscope during the etching step to the monitor progress.

A method for inspecting and analyzing defects in a dielectric film on a semiconductor chip includes the steps of providing a chamber for inspecting and analyzing the semiconductor chip, the chamber including an ion beam gun and an electron beam gun focused to a substantially same position, mounting the semiconductor chip into the chamber such that a target area includes a dielectric layer with potential defects therein in proximity to the substantially same position, and maintaining the semiconductor chip in the chamber while performing the following steps: removing material in proximity of the target area to expose defects in the dielectric layer, etching silicon material obscuring defects in the dielectric layer selective to the dielectric layer such that the silicon material is removed from the dielectric layer while the dielectric layer remains substantially intact, and monitoring the progress of the etching step to observe the potential defects.

In other methods, the chamber may further include an injector for injecting xenon difluoride into the chamber for etching, and the step of etching may include etching the silicon material with xenon difluoride or with xenon difluoride in the presence of an electron beam. The step of monitoring the progress of the etching step may include the step of employing a scanning electron microscope during the etching step to monitor the progress.

These and other objects, features and advantages of the present invention will become apparent from the following detailed description of illustrative embodiments thereof, which is to be read in connection with the accompanying drawings.

BRIEF DESCRIPTION OF DRAWINGS

This disclosure will present in detail the following description of preferred embodiments with reference to the following figures wherein.

DETAILED DESCRIPTION OF PREFERRED EMBODIMENTS

The present invention relates to semiconductor failure analysis and more particularly, to a failure analysis method which employs xenon-difluoride gas for preparing semiconductor chips for the failure analysis. The present invention provides a method for preparing and highlighting semiconductor samples without removing the sample from the inspection chamber. In a preferred embodiment of the present invention, a selective etchant (i.e. $XeF_2$ which is silicon selective) is employed to etch Si through pinholes in dielectric layers, for example, $SiO_x$, $Si_xN_y$ or Si-oxynitride ($Si_xO_yN_z$). Advantageously, the present invention permits all final preparation and highlighting steps to be done in a dual beam FIB/SEM in-situ.

A cross-section through a sample may be obtained using a FIB. Selective staining may be provided using a $XeF_2$ injector which may advantageously be included with an inspection chamber. The inspection is preferably performed using a SEM, although other tools may be employed. The method(s) of present invention may be performed without removing the sample from the chamber.

The present invention eliminates ex-situ steps and replaces them with in-situ steps in a dual beam (FIB/SEM) chamber for both the staining as well as the delayering/polishing steps. The methods of the present invention are very time-efficient and reliable because sample transfer is not necessary once the sample is introduced into the FIB/SEM chamber. The delayering and staining steps can be monitored with highest SEM-precision at any time during the process. This eliminates the usual dependencies and uncertainties due to changed external conditions or sample properties conventional methods suffer from.

Figure 1:
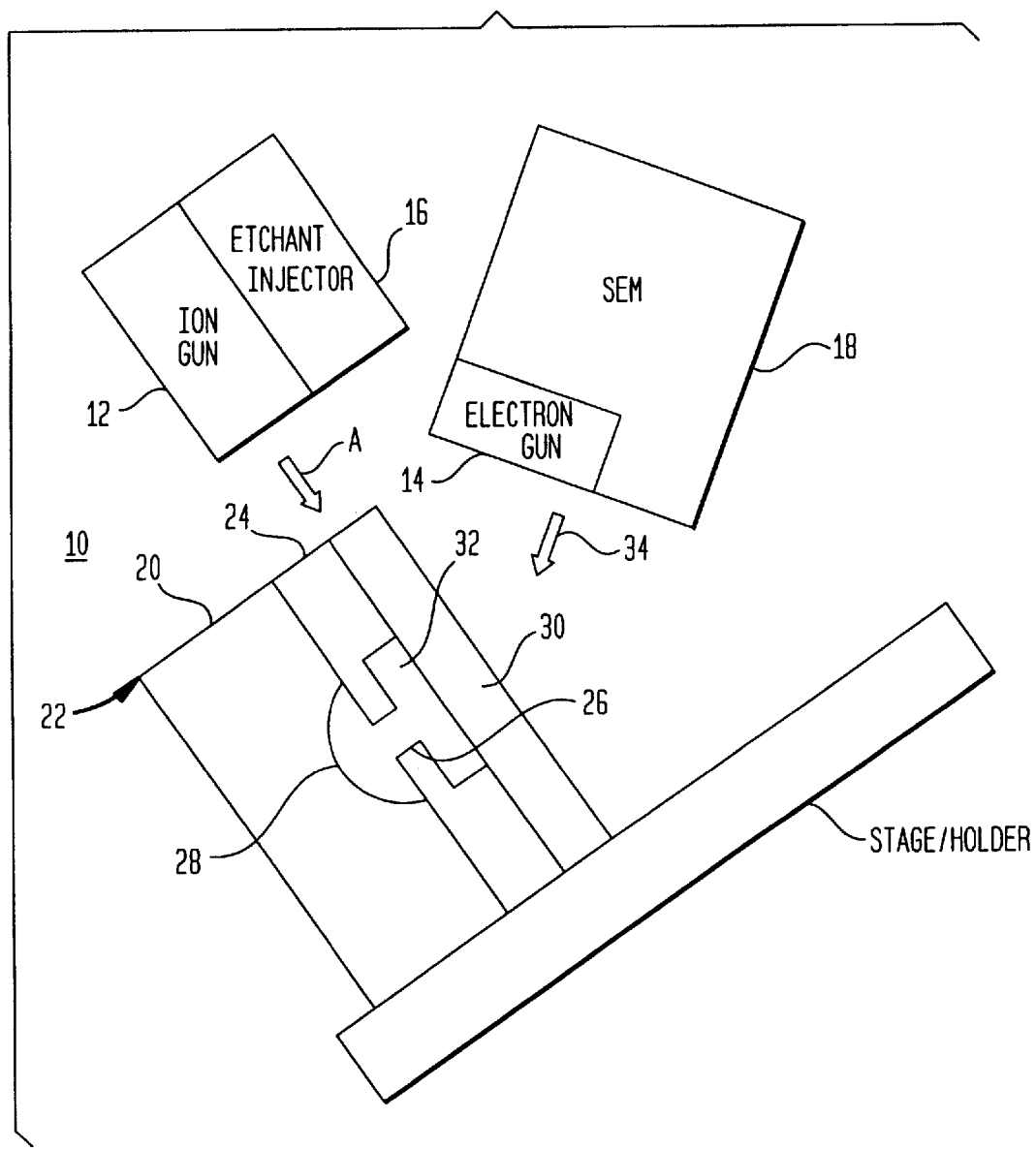
FIG. 1 is a cross-sectional view of a focused ion beam and electron beam chamber with a sample mounted therein for use with the present invention such that a layer to be inspected on the sample is parallel to a major surface of the sample.

Referring now in specific detail to the drawings in which like reference numerals identify similar or identical elements throughout the several views, FIG. 1, a dual beam chamber 10 is shown for performing the method in accordance with the present invention. Dual beam chamber 10 may be an XL 830 apparatus, available commercially from FEI Company of Hillsboro, Oregon. In one embodiment, a dual beam chamber is employed to analyze a dielectric layer in dynamic random access memories (DRAM) or other microchips, in particular microchips printed in sub 0.25 um technology. Chamber 10 includes an ion gun 12 and an electron gun 14 (which is preferably included on a scanning electron microscope) both focused to a substantially same spot. Chamber 10 also includes an etchant injector 16 for introducing etchant gas into chamber 10. In a preferred embodiment, the etchant gas includes $XeF_2$ gas although other etchants may be employed. Injector 16 is preferably aligned to an electron beam which is introduced by an electron beam gun 14 (SEM).

Chamber 10 includes a scanning electron microscope 18 or other observation device to advantageously observe samples and their failure modes, or to observe etching processes to chart progress, etc. Chamber 10 is depicted having a failure sample 20 loaded therein. Sample 20 is polished or cleaved on an edge 22 to expose a cross-section of layers on sample 20. In this illustrative example, edge 22 is substantially perpendicular to an ion beam direction shown by arrow "A". In the illustrative example, an insulating layer 24 has a hole 26 which is filled with Si material 28. Edge 22 is created approximately 5 microns or more away from a target area which is centered about a failure site or suspected failure site. Layers 30 on top of insulating layer 24 are removed by the ion beam (FIB). When a silicon region 32 is exposed, the ion beam is turned off, and an etchant gas is introduced. Etchant gas preferably includes $XeF_2$ gas. However, other etchant gases may be employed if they are compatible with chamber 10 and its components and the etchant gas selectively etches a material to be removed relative to a material or feature to be observed. In this case, silicon region 32 is removed selective to the insulating layer 24. In other embodiments of the present invention, different components may be viewed by selective etching, for example, conductive components, doped regions, dielectrics, organic compounds etc. Advantageously, in accordance with the present invention, the etch process is carried out within chamber 10 and can readily be observed. Electrons from an electron beam 34 are used to observe the target are preferably using a SEM. In this way, etching progress may be closely monitored until the features which are desired to be observed by the user are exposed.

$XeF_2$ gas has been employed as a source of highlighting FIB cross-sections by selectively etching doped or undoped silicon (Si). In accordance with the present invention, by cutting close enough to a target area and by increasing the exposure time of the surface to $XeF_2$ (or other etchant gases) well beyond typical times used for highlighting cross-sections, the present invention is able to remove any Si covering the insulating layers without noticeably attacking the insulating layer. Holes in thin oxides, for example, may then be highlighted by etching through these holes and by attacking the underlying Si layer as described in the above illustrative example.

The whole staining process is precisely monitored with the resolution of the scanning electron microscope (SEM) in-situ during the chemical reaction. The etching process may be discontinued at any time to make observations measurements, etc. For optimum results, it is recommended to de-layer or cross-section the sample as close as possible to the target area. This may be done with the ex-situ methods described previously. In one embodiment, however, the method of in-situ staining becomes very powerful when combined with the capabilities of a FIB. In this case, the FIB is used to cut close to the target area using the ion beam. Subsequently $XeF_2$ or equivalent gas is applied to a target surface with the ion beam switched off and the electron beam switched on, discontinuously, to monitor the progress of chemical etching. The $XeF_2$ stain is immune to usual electron raster burn associated with single scans with the electron beam. The staining may also be performed in a SEM character only (without ion beam) but equipped with a $XeF_2$ injector.

With continued reference to FIG. 1, in one illustrative application of the present invention performed by the inventors, gate oxide holes on 0.2 um DRAM technology had to be localized. After a rough cross-section of the sample approximately 5 microns away from the target using standard diamond lapping methods, the sample was introduced into chamber 10 and the target area is milled in a fine polishing mode top down using a 150 pA ion beam. Using the SEM, it was verified that most of the Poly-Si of the gate stack of the cell transistor was removed and the active area was exposed leaving only a few 10–50 nm of silicon above the target area. In steps of five seconds, the surface was exposed to $XeF_2$ gas and the Si-removal was monitored with the SEM. After approximately 2 minutes of total exposure time, a pin hole at the upper edge of the active area was clearly visible proving the suspected fail mechanism of this cell.

The same method may be applied for the inspection of other dielectric layers, e.g. the isolation of holes in a node dielectric of a deep trench capacitor of a DRAM microchip.

Figure 2:
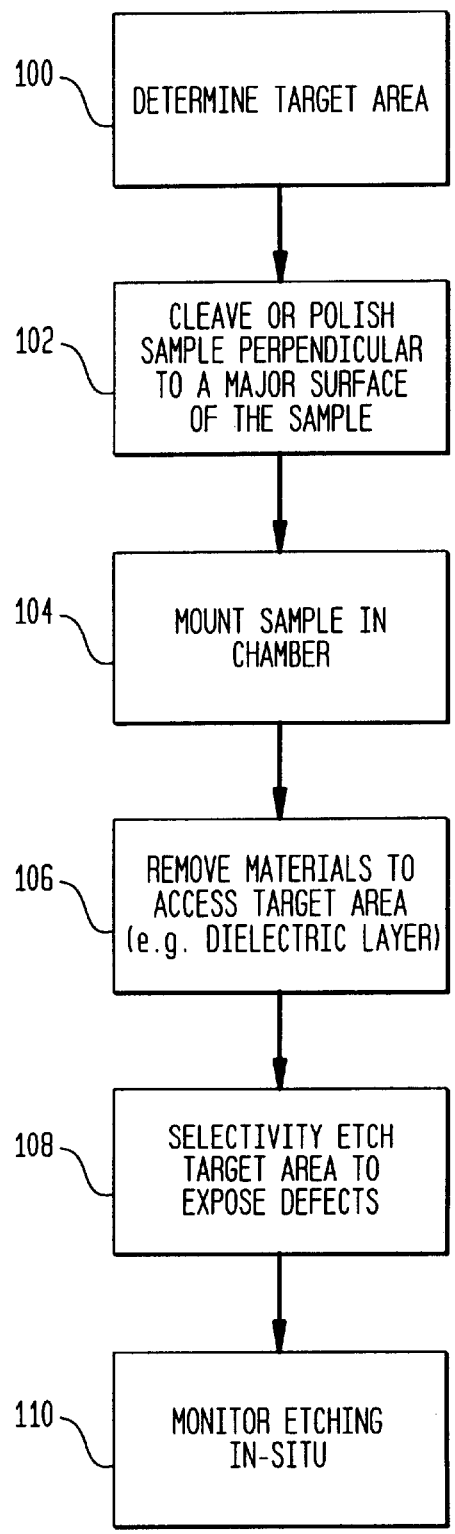
FIG. 2 is a flow diagram for a method for inspecting a semiconductor device mounted as shown in FIG. 1 in accordance with the present invention.

Referring to FIG. 2, a flow diagram is shown for a method of inspecting a semiconductor device in accordance with the present invention. The method shown in FIG. 2 is applicable to staining features in layers parallel to a sample's surface (see FIG. 1). A sample's surface may be defined by the major surface of a semiconductor chip. In a block 100, a target region or area is determined based on component failures or component problems. In a block 102, a rough cleave or mechanical polish is performed on a sample to be analyzed. In a preferred embodiment, the cleave or polish is maintained about 5 microns or more away from a target area or area of interest. In block 104, the sample is mounted within a chamber which includes both an ion beam, for example, FIB and a microscope, for example, an SEM. In a preferred embodiment, the chamber is a FIBSEM chamber.

The layers of the sample (the sample is preferably a semiconductor device) are mounted parallel to the ion beam direction (from FIB), i.e., perpendicular to the cleaved surface, and transverse to the electron beam direction (for the SEM). In block 106, the layers above the target area are removed preferably using the ion beam. The SEM is used to periodically check the sample to identify when the desired region is uncovered or exposed for observation. In block 108, upon reaching a desired position (the target area), the ion bean is turned off and etchant gas is introduced with or without the electron beam turned on. The etchant gas is preferably $XeF_2$. The area is observed periodically using the SEM to observe etch progress and to observe failures or elements as the case may be. In block 110, etching is stopped upon the uncovering of holes, observation of defects or upon reaching a position to be observed or analyzed.

Figure 3:
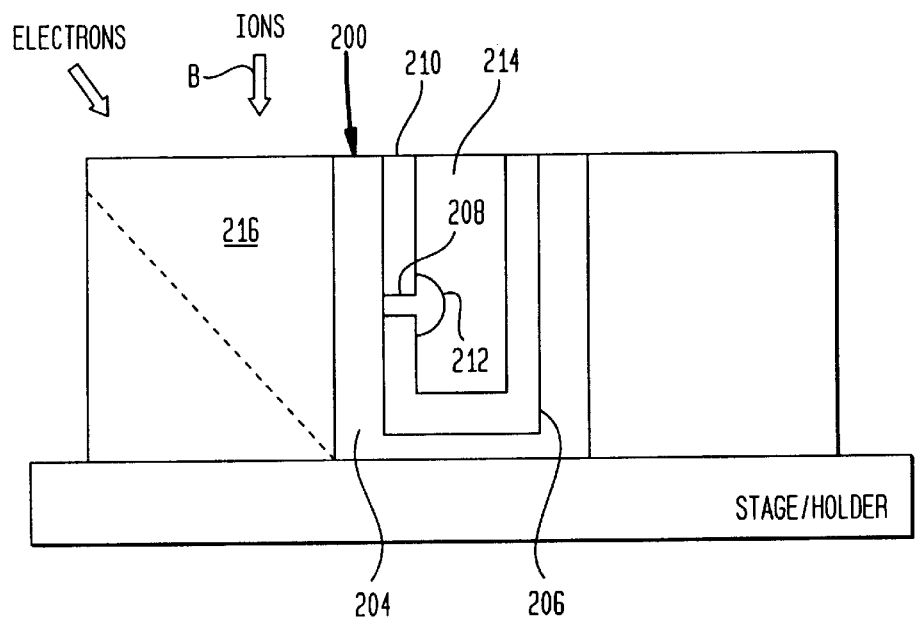
FIG. 3 is a cross-sectional view of a focused ion beam and electron beam chamber with a sample mounted therein for use with the present invention such that a layer to be inspected on the sample is perpendicular to a major surface of the sample.

Referring now to FIG. 3, an illustrative example for staining of a semiconductor device having layers perpendicular to the sample surface is shown. A sample 200 may include deep trench capacitors or other vertically disposed components of the semiconductor device. Sample 200 includes material to be removed 216 from either or both sides of a target area. A silicon region 204 surrounds a trench 206. A hole 208 has breached an insulating layer 210 and silicon material 212 from silicon region 204 has filled hole 208 to connect to a region 214 including a silicon compound. Area 216 adjacent to silicon region 204 may be removed by ions from an ion gun. This exposes a surface for electrons to fall incident thereon for viewing using a SEM.

Figure 4:
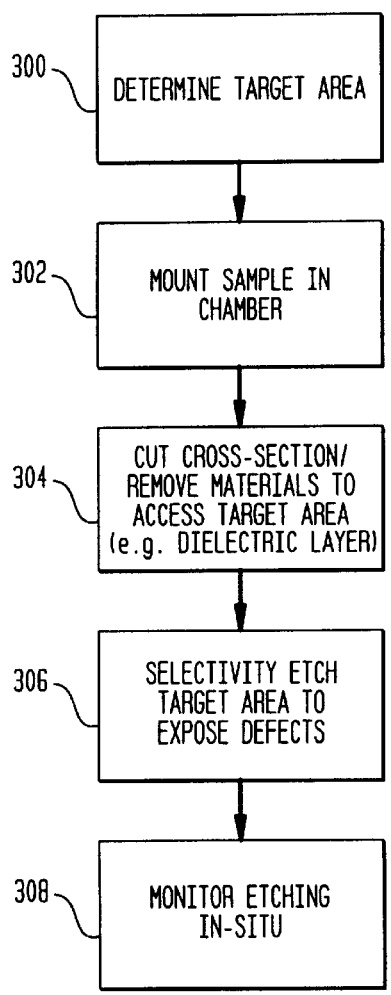
FIG. 4 is a flow diagram for a method for inspecting a semiconductor device mounted as shown in FIG. 3 in accordance with the present invention.

Referring to FIG. 4 with continued reference to FIG. 3, a method for observing sample 200 of FIG. 3 is shown. The method shown in FIG. 4 is applicable to staining features in layers perpendicular to a sample's surface (see FIG. 3). A sample's surface may be defined by the major surface of a semiconductor chip. In a block 300, a target region or area is determined based on component failures or component problems. In a block 302, the sample is mounted within a chamber, for example, a FIBSEM chamber. The sample is mounted such that the ion beam is capable of cutting cross-sections in the sample 200, i.e., substantially perpendicular to the major surface of the chip in the direction of arrow "B". In block 304, a deep ion beam cut is performed on either side of the target area until only silicon material of silicon region 204 remains over the target area. The SEM is used to periodically check to identify when the desired region is uncovered or exposed for observation.

In block 306, upon reaching a desired position (target area), the ion bean is turned off and etchant gas is introduced with or without the electron beam turned on. The etchant gas is preferably $XeF_2$. The area is observed periodically using the SEM to observe etch progress and to observe failures or elements as the case may be. In block 308, etching is stopped upon the uncovering of holes, observation of defects or upon reaching a position to be observed or analyzed.

It is to be understood, that the present invention provides many advantages over the prior art. For example, etching processes are typically performed outside the chamber in the prior art. However, in accordance with the present invention, the etching processes are performed in-situ within the chamber without having to remove and remount the sample. The e-beam permits precise monitoring of the etch process, thus minimizing the risk of over-etching. The present invention is very selective to particular defects and provides site-specific failure analysis. The present invention may be employed in the semiconductor industry or in other industries which perform failure analysis between selectively etchable materials. The samples analyzed may include various materials including dielectrics, metal, organic compounds, etc.

Having described preferred embodiments for an in-situ method for preparation and highlighting of defects for failure analysis (which are intended to be illustrative and not limiting), it is noted that modifications and variations can be made by persons skilled in the art in light of the above teachings. It is therefore to be understood that changes may be made in the particular embodiments of the invention disclosed which are within the scope and spirit of the invention as outlined by the appended claims. Having thus described the invention with the details and particularity required by the patent laws, what is claimed and desired protected by Letters Patent is set forth in the appended claims.

What is claimed is:

1. A method for inspecting a sample for failures comprising the steps of:
    determining a target area for observation on the sample;
    preparing a region in proximity to the target area to provide access to the target area;
    mounting the sample in a chamber, the chamber providing a capability for removing the material in proximity of the target area and providing a capability for observing the sample in-situ;
    maintaining the sample in the chamber while performing the following steps:
        etching a first material selective to a second material such that the target area has the first material removed therefrom to expose the second material such that the second material is preserved for observation; and
        monitoring the progress of the etching step to determine a time to discontinue the etching.

2. The method as recited in claim 1, wherein the sample includes a major surface and the first and second materials are disposed substantially perpendicular to the major surface and the step of preparing includes the step of:
    cutting away material in the region in proximity to the target area to provide access to the target area in a direction perpendicular to the major surface.

3. The method as recited in claim 2, wherein the step of cutting away material includes cutting away material by employing an ion beam.

4. The method as recited in claim 1, wherein the sample includes a major surface and the first and second materials are disposed substantially parallel to the major surface and the step of preparing includes the steps of:
    cleaving the sample to form an edge perpendicular to a layer of at least one of the first material and the second material in the region in proximity to the target area; and
    providing access to the target area in a direction parallel to the major surface.

5. The method as recited in claim 1, wherein the sample includes a major surface and the first and second materials are disposed substantially parallel to the major surface and the step of preparing includes the steps of:
    polishing the sample to form an edge perpendicular to a layer of at least one of the first material and the second material in the region in proximity to the target area; and
    providing access to the target area in a direction parallel to the major surface.

6. The method as recited in claim 1, wherein the sample includes a plurality of layers disposed substantially parallel to a major surface and the first and second materials are disposed substantially parallel to the major surface, wherein the step of mounting the sample into a chamber includes the step of delayering the plurality of layers to expose the target area.

7. The method as recited in claim 1, wherein the first material is silicon and the second material is a dielectric, and the method step of etching includes the step of etching the first material selective to the second material with xenon difluoride.

8. The method as recited in claim 1, wherein the step of etching the first material selective to the second material with xenon difluoride includes the step of etching the first material selective to the second material with xenon difluoride in the presence of an electron beam.

9. The method as recited in claim 1, wherein the step of monitoring the progress of the etching step includes the step of employing a scanning electron microscope during the etching step to monitor the progress.

10. A method for inspecting a semiconductor sample for defects in a dielectric layer comprising the steps of:

determining a target area for observation on the semiconductor sample based on a site of a failed device;

preparing a region in proximity to the target area to provide access to the target area;

mounting the semiconductor sample in a chamber, the chamber providing a capability for removing the material in proximity of the target area and providing a capability for observing the semiconductor sample in-situ;

maintaining the semiconductor sample in the chamber while performing the following steps:

removing the material in proximity of the target area, the target area including a dielectric layer, wherein a silicon material obscures the dielectric layer;

etching the silicon material selective to the dielectric layer such that the silicon material is removed from the dielectric layer while the dielectric layer remains substantially intact; and monitoring the progress of the etching step to observe potential defects in the dielectric layer.

11. The method as recited in claim 10, wherein the semiconductor sample includes a major surface and the dielectric layer is disposed substantially perpendicular to the major surface and the step of preparing includes the step of:

cutting away material in the region in proximity to the target area to provide access to the target area in a direction perpendicular to the major surface.

12. The method as recited in claim 11, wherein the step of cutting away material includes cutting away material by employing an ion beam.

13. The method as recited in claim 10, wherein the semiconductor sample includes a major surface and the dielectric layer is disposed substantially parallel to the major surface and the step of preparing includes the steps of:

cleaving the semiconductor sample to form an edge perpendicular to the dielectric layer; and providing access to the target area in a direction parallel to the major surface.

14. The method as recited in claim 10, wherein the semiconductor sample includes a major surface and the dielectric layer is disposed substantially parallel to the major surface and the step of preparing includes the steps of:

polishing the semiconductor sample to form an edge perpendicular to the dielectric layer in the region in proximity to the target area; and providing access to the target area in a direction parallel to the major surface.

15. The method as recited in claim 10, wherein the semiconductor sample includes a plurality of layers disposed substantially parallel to a major surface and the dielectric layer is disposed substantially parallel to the major surface, wherein the step of removing the material in proximity of the target area includes the step of delayering the plurality of layers to expose the target area.

16. The method as recited in claim 10, wherein the step of etching includes the step of etching the silicon material with xenon difluoride.

17. The method as recited in claim 10, wherein the step of etching the silicon material with xenon difluoride includes the step of etching the silicon material with xenon difluoride in the presence of an electron beam.

18. The method as recited in claim 10, wherein the step of monitoring the progress of the etching step includes the step of employing a scanning electron microscope during the etching step to monitor the progress.

19. A method for inspecting and analyzing defects in an dielectric film on a semiconductor chip comprising the steps of:

providing a chamber for inspecting and analyzing the semiconductor chip, the chamber including an ion beam gun and an electron beam gun focused to a substantially same position;

mounting the semiconductor chip into the chamber such that a target area including a dielectric layer exists in proximity to the substantially same position;

maintaining the semiconductor chip in the chamber while performing the following steps:

removing material in proximity of the target area using the ion beam gun to expose the dielectric layer;

etching silicon material obscuring any defects in the dielectric layer selective to the dielectric layer such that the silicon material is removed from the dielectric layer while the dielectric layer remains substantially intact; and monitoring the progress of the etching step to observe any defects.

20. The method as recited in claim 19, wherein the chamber further includes an injector for injecting xenon difluoride into the chamber for etching and the step of etching includes the step of etching the silicon material with xenon difluoride.

21. The method as recited in claim 19, wherein the step of etching the silicon material with xenon difluoride includes the step of etching the silicon material with xenon difluoride in the presence of an electron beam.

22. The method as recited in claim 19, wherein the step of monitoring the progress of the etching step includes the step of employing a scanning electron microscope during the etching step to monitor the progress.

* * * * *